United States Patent

Kurauchi et al.

Patent Number: 6,043,857
Date of Patent: Mar. 28, 2000

[54] LIQUID CRYSTAL DISPLAY APPARATUS

[75] Inventors: Shoichi Kurauchi; Hitoshi Hatoh, both of Yokohama, Japan

[73] Assignee: Kabushiki Kaisha Toshiba, Japan

[21] Appl. No.: 08/824,639

[22] Filed: Mar. 27, 1997

Related U.S. Application Data

[63] Continuation of application No. 08/443,018, May 17, 1995, Pat. No. 5,681,675.

[30] Foreign Application Priority Data

May 18, 1994 [JP] Japan ................................. 6-103679

[51] Int. Cl.[7] .................................................. G02F 1/1335
[52] U.S. Cl. ................................ 349/106; 349/44; 430/7
[58] Field of Search ........................ 430/7, 321; 347/106, 347/107; 349/106, 110, 42, 44, 143

[56] References Cited

U.S. PATENT DOCUMENTS

| | | | |
|---|---|---|---|
| 4,725,517 | 2/1988 | Nakanowatari et al. | 430/20 |
| 5,008,166 | 4/1991 | Aoki | 430/7 |
| 5,079,214 | 1/1992 | Long et al. | 430/7 |
| 5,391,442 | 2/1995 | Tsushima et al. | 430/7 |
| 5,446,562 | 8/1995 | Sato | 349/42 |
| 5,585,951 | 12/1996 | Noda et al. | 349/42 |
| 5,716,740 | 2/1998 | Shiba et al. | 430/7 |

FOREIGN PATENT DOCUMENTS

| | | | |
|---|---|---|---|
| 0636931 | 2/1995 | European Pat. Off. | |
| 0636932 | 2/1995 | European Pat. Off. | |
| 59-75205 | 4/1984 | Japan | |
| 61-077014 | 4/1986 | Japan | |
| 61-245106 | 10/1986 | Japan | |
| 62-042122 | 2/1987 | Japan | |
| 62-81604 | 4/1987 | Japan | |
| 63-294503 | 12/1988 | Japan | |
| 1-217302 | 8/1989 | Japan | |
| 4-39603 | 2/1992 | Japan | |
| 4-86801 | 3/1992 | Japan | |
| 4-277722 | 10/1992 | Japan | 349/106 |
| 5-53118 | 3/1993 | Japan | |
| 5-173010 | 7/1993 | Japan | |
| 5-181010 | 7/1993 | Japan | |
| 7-134290 | 5/1995 | Japan | |

*Primary Examiner*—John A. McPherson
*Attorney, Agent, or Firm*—Finnegan, Henderson, Farabow, Garrett & Dunner, L.L.P.

[57] ABSTRACT

Ultraviolet light is selectively radiated onto a portion corresponding to each pixel on a color accepting base layer and only this portion is activated. Thus, the accepting ability (coloring ability or absorbing ability) of the coloring material for a color filter in this portion is higher than that of the other portions to which the ultraviolet light is not radiated. Alternatively, with an ultraviolet light hardening resin as the material of the color accepting base layer, the accepting layer to which the ultraviolet light is radiated and hardened is formed in an island shaped pattern. The other portions are not hardened and can be removed. The coloring material of the color filter is projected to the accepting layer formed corresponding to each pixel and only this portion can be selectively colored.

4 Claims, 13 Drawing Sheets

LIQUID CRYSTAL DISPLAY APPARATUS

This is a continuation of application Ser. No. 08/443,018, filed May 17, 1995, now U.S. Pat. No. 5,681,675.

BACKGROUND OF THE INVENTION

1. Field of the Invention

The present invention relates to a fabricating method of a liquid crystal display apparatus, in particular, a fabricating method of a liquid crystal display apparatus having a color filter free of blurring of colors at a boundary region of coloring portions, thereby displaying a clear and high quality color image.

2. Description of the Related Art

In a conventional liquid crystal display apparatus, two electrode substrates are faced with a cell gap. Each of the electrode substrates has electrodes that generate pixels. A liquid crystal layer is held between the two electrode substrates so that the peripheral portion of the liquid crystal layer is sealed. In this manner, the principal portions of the liquid crystal display apparatus are constructed.

This construction can be applied for both a simple matrix type liquid-crystal display apparatus and an active matrix type liquid crystal display apparats.

In a liquid crystal display apparatus that can displays an color image on the screen, a color filter is used.

The color filter is constructed by disposing color cells of three primary colors or a plurality of hues such as R. G. and B (red, green, and blue) or Y, M, and C (yellow, magenta, and cyan) corresponding to individual pixels on at least one of the two electrode substrates.

For example, in a color dot matrix liquid crystal display apparatus of the simple matrix driving type, a scanning electrode substrate having scanning electrodes horizontally patterned in a strip shape and a signal electrode substrate having a color filter and signal electrodes vertically patterned in a stripe shape are disposed in face of, with a gap (referred to as a cell gap), in such a manner that the scanning electrodes are disposed nearly perpendicular to the signal electrodes. A liquid crystal material is held in the gap and the peripheral portions of the substrates are sealed.

In a color liquid crystal display apparatus of the active matrix driving type, a TFT array substrate and an opposite substrate are faced with a cell gap. The TFT array substrate has thin film transistors (referred to as TFTs), pixel electrodes, scanning lines, and signal lines. In the TFTs, for example amorphous silicon (referred to as a-Si) is used as a semiconductor layer. A color filter constructed of color cells of for example three primary colors R, G, and B is formed on at least one of the TFT array substrate and the opposite substrate.

The gap is filled with a liquid crystal material and the peripheral portion thereof is sealed. As the liquid crystal layer, nematic liquid crystal with positive or negative permittivity anisotropy is used.

Using the rotating ability of the plane of polarization of light in the nematic liquid crystal, the rotation of the plane of polarization of each pixel is controlled. In addition to the effect of polarization of two polarizing plates that vertically hold the liquid crystal display cells, the transmission of light that passes through the liquid crystal display cells is controlled so as to display an image.

In the liquid crystal display apparatus that displays an image in colors, a color filter is used.

Many fabricating methods of the color filters such as pigment dispersing method, dye dispersing method, electrodepositing method, and printing method. have been proposed. In the pigment dispersing method, a pigment is dispersed to a layer to be colored and thereby a color filter is formed. In the dye dispersing method, a dye is dispersed to a layer to be colored and thereby a color filter is formed. In the electrodepositing method, a color filter is formed by electrodeposition. In the printing method, a coloring material of the color filter that is an ink is printed on a substrate using a printing plate such as an intaglio printing plate or an offset plate. Some of these methods have been practically used.

However, in such conventional fabricating methods, since photo fabricating processes are often used, the process becomes very complicated.

In addition, to deal with pixel sizes that are becoming smaller and smaller, the accuracy of the photo fabrication process should be improved. However, it is difficult to fabricate such color filters with high accuracy and high yield.

In the printing method, although the photolithographic technologies are not directly used, the fabrication of the printing plates is very complicated. Moreover, in the printing method, it is difficult to form precise color filters that correspond to the sizes of fine pixels.

A fabricating method of a fine color filter that does not require the above-described photolithographic process has been proposed. In this method, a coloring material is sprayed onto an accepting layer by an ink jet unit.

However, when a color filter is formed by the ink jet method, the sprayed coloring material may blur with another coloring material at a boundary region thereof. Thus, it is difficult to reproduce clear colors.

Thus, even if color filters with very high throughput are formed by an ink jet unit, the reproducibility of colors of the color filters is low. Consequently, the color reproducibility and display quality of color images of the liquid crystal apparatus using the color filters fabricated by the conventional ink jet method are low.

SUMMARY OF THE INVENTION

An object of the present invention is to provide a fabricating method of a liquid crystal display apparatus that can be fabricated with a simple process and high throughput and that has a color filter with high color reproducibility for each pixel free of blurring of colors at a boundary region thereof.

To accomplish such an object, an aspect of the present invention is a fabricating method of a liquid crystal display apparatus, comprising the steps of forming a first electrode on a first substrate, forming a second electrode disposed in face of the first electrode on a second substrate and forming a pixel, forming a color accepting base layer on at least one of the first substrate and the second substrate, causing the accepting ability of a portion corresponding to the pixel on the color accepting base layer to a coloring material for a color filter to be higher than the other portion on the color accepting base layer and forming an accepting layer, spraying the coloring material of the color filter to the accepting layer with an ink jet unit, coloring the accepting layer, and forming the color filter, and disposing in face of the first substrate and the second substrate with a gap, sealing the peripheral portions of the first substrate and the second substrate, and filling the gap with a liquid crystal layer.

As a method for causing the accepting ability of a portion corresponding to each pixel of a color accepting base layer to a coloring material for a color filter to be higher than that of the other portion, ultraviolet ray light is radiated onto the color accepting base layer.

In addition, there are following alternative methods. For example, the color accepting base layer is heated. An energy beam other than ultraviolet lay is radiated to the color accepting base layer. A so-called ashing treatment is performed for the color accepting base layer. In these methods, the accepting ability to the coloring material for the color filter on the color accepting base layer can be improved.

As a material of the color accepting base layer, an ultraviolet light hardening resin is used. Ultraviolet light is selectively radiated onto a pixel portion (corresponding to each color cell as a color filter). Thus, the portion of the color accepting base layer material to which the ultraviolet light is radiated is hardened and the accepting ability to the coloring material is improved.

The hardened portion has a higher resistance to a solvent. In contrast, the non-hardened portion to which the ultraviolet light is not radiated is easily meltable by a solvent. Thus, the non-hardened portion is removed by the solvent and only the hardened portion is selectively left. In other words, the accepting layer can be selectively formed only at a portion on which each color cell of the color filter is formed.

The selective radiation of ultraviolet light to the required portion may be performed with a photomask.

The selective radiation of ultraviolet light may be performed by an exposing device referred to as a pattern generator. The pattern generator is provided with an aperture. By changing the shape of the aperture, the exposure pattern is controlled.

The selective radiation of ultraviolet light may be performed with a light insulating layer that functions as a self alignment mask.

In the case of the fabricating method of the active matrix type liquid crystal display apparatus, the selective radiation of ultraviolet light may be performed with scanning lines and signal lines that function as a self alignment mask.

The light insulating layer that covers the non-pixel portion may be patterned by a photolithographic process with the above-described color filter or the accepting layer that functions as a self alignment mask.

The above-described color filter and light insulating layer can be applied for both the fabricating methods of the simple matrix type liquid crystal display apparatus and the active matrix type liquid crystal display apparatus.

It should be noted that the present invention can be applied for a color filter formed on a substrate rather than a liquid crystal panel.

The color filter fabricated according to the present invention may be disposed on an electrode such as a pixel electrode above a substrate such as a glass substrate or between such an electrode and such a substrate. When a color filter is disposed below an electrode, the accepting layer should be colored before the electrode is formed.

Electrodes may be disposed above and blow the color filter. In particular, when a color filter is disposed on an active matrix substrate, an auxiliary capacitance or the like can be formed with an electrode disposed below the color filter. Thus, the electrode above the color filter can be used as a pixel electrode. From this point of view, it is preferable to disposed electrodes above and below the color filter.

The radiation of ultraviolet light to the color accepting base layer and the color filter may be colored for each of a plurality of colors of the color filter.

Alternatively, with one ultraviolet light radiating process and one coloring process, the color filter may be colored for all colors at the same time.

To improve the throughput, it is preferable to color the color filter for all the colors at the same time. However, to improve the accuracy of fine pixels and prevent the colors from blurring, it is preferable to color the color filter for each of colors.

In the fabricating method of the liquid crystal display apparatus according to the present invention, since ultraviolet light is selectively radiated onto a portion corresponding to each pixel of the color accepting base layer, only the radiated portion is activated and the accepting ability (color accepting ability or absorbing ability) of the coloring material of the color filter becomes higher than that of the non-radiated portion.

Alternatively, as a material of the color accepting base layer, an ultraviolet light hardening resin may be used. A portion to which ultraviolet light is radiated is hardened and left as an island shape pattern of an accepting layer. The other portion is not hardened, but removed.

In the above-described method, the coloring material may be sprayed to a portion corresponding to each pixel of the color filter so as to selectively color the portion. On the other hand, since the coloring material is not sprayed to the portions other than the pixels, the coloring material does not blur at a boundary region of adjacent pixels.

Thus, the color filter with color cells corresponding to pixels that are separated by the boundary regions can be formed. Consequently, the liquid crystal display apparatus that displays a color image free of blurring of colors at the boundary region of each pixel can be accomplished.

As a material of the above-described color accepting base layer that is activated by exposure of ultraviolet light (thereby the accepting ability to the coloring material is improved), polyvinyl alcohol, casein, acrylic resin, or epoxy denatured acrylic substance are preferably used.

Alternatively, since polysilane has an accepting ability for only a portion exposed to ultraviolet light, it is suitably used for a material of the color accepting base layer.

As a material of the ultraviolet light hardening resin layer, a photosensitive solution of a mixture of dichromate and natural protein base, or a substance of which a photosensitive ability is added to one of acrylic resin, epoxy denatured acrylic resin, or PVA is preferably used.

As an example of the coloring material having a high coloring ability to the accepting layer, a dye or a pigment that is conventionally used in the dye dispersing method or pigment dispersing method for fabricating the color filter can be used.

The thickness of the accepting layer depends on the coloring ability (spectral transmittivity) required for the color filter and the type of the coloring material. When a practical color filter is formed, the thickness of the accepting layer is preferably in the range from 0.2 $\mu$m to 4.0 $\mu$m.

As the type of the ultraviolet light (namely the wavelength and intensity thereof), under the above-described conditions of the accepting layer and the coloring material, the wavelength of the ultraviolet light is preferably in the range from 250 nm to 420 nm. The intensity of the ultraviolet light is preferably in the range from 5 mW/cm$^2$ to 100 mW/cm$^2$.

When the radiated portion of the color accepting base layer is activated under the above-described conditions of the material of the accepting layer and the coloring material, the radiating time of the ultraviolet light is preferably in the range from 5 seconds to 80 seconds.

When the radiated portion of the ultraviolet light hardening type resin layer is hardened, the process temperature thereof is preferable in the range from 150° C. to 250° C.

FIG. 5 shows regions suitable for the activating or hardening of the color accepting base layer to which the ultraviolet light is radiated in the case that the thickness of the color accepting base layer, the wave length and intensity of the ultraviolet light, and the radiating time are varied under the above-described conditions of the color accepting base layer and the coloring material. In FIG. 5, the radiating condition of the ultraviolet light in the region on the right over the curve of each film thickness can be used as the radiating condition suitable for each film thickness.

When the ultraviolet light is radiated onto a portion corresponding to each pixel of the color accepting base layer, the color accepting base layer is formed on the nearly entire surface of the substrate. The ultraviolet light is radiated onto a portion corresponding to each pixel of the color accepting base layer by for example a stepper exposing unit used for LSI fabrication on step-and-repeat basis.

Alternatively, with a mask of a light insulating layer (referred to as a black matrix) patterned for covering a boundary region of each pixel, the ultraviolet light is radiated onto a portion that is exposed, not covered by the light insulating layer. With a self alignment mask of the light insulating layer, the ultraviolet light can be selectively radiated onto each pixel.

Thus, the fabricating process of the color filter that has high image reproducibility free of burring at the boundary region of each pixel can be remarkably simplified.

In the case of the active matrix type liquid crystal display apparatus, each pixel is formed inside each lattice element formed by scanning lines and signal lines. With a self alignment mask of the lattice formed by the scanning lines and the signal lines, the ultraviolet light is selectively radiated onto the color accepting base layer exposed from the lattice. Thus, the radiating process of the ultraviolet light can be remarkably simplified.

The color accepting base layer corresponding to each pixel to which the ultraviolet light is radiated is actively colored by the coloring material. In contrast, the boundary region of adjacent pixels is least colored. In other words, the accepting layer is not formed at the boundary region. Thus, the blurring of different colors at the boundary region of the adjacent pixels can be very effectively prevented. As a result, since the liquid crystal display apparatus with the color filter that does not cause the color of each pixel to blur and thereby displays a clear image can be easily fabricated.

These and other objects, features and advantages of the present invention will become more apparent in light of the following detailed description of best mode embodiments thereof, as illustrated in the accompanying drawings.

DESCRIPTION OF THE PREFERRED EMBODIMENTS

First Embodiment

In a first embodiment of the present invention, the art of the present invention is applied for a simple matrix type liquid crystal display apparatus. A light insulating layer is used as a mask. Ultraviolet light is radiated onto each pixel portion of a color accepting base layer so that it is activated. Electrodes are disposed on a color filter.

Figure 1:
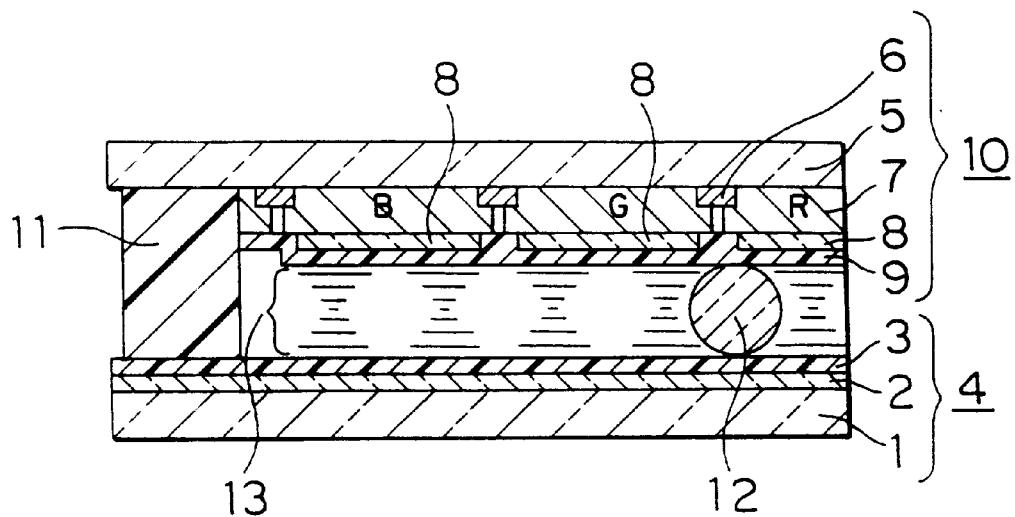
FIG. 1 is a sectional view showing the construction of a liquid crystal display apparatus fabricated by a fabricating method according to a first embodiment of the present invention.

FIG. 1 is a sectional view showing the construction of a liquid crystal display apparatus fabricated by a fabricating method according to the first embodiment of the present invention.

The liquid crystal display apparatus comprises a scanning electrode substrate 4, a signal electrode substrate 10, and a liquid crystal layer 13. The scanning electrode substrate 4 comprises a glass substrate 1, a scanning electrode 2 formed as a first electrode on the glass substrate 1, and an aligning film 3 that covers the nearly entire surface of the substrate. The signal electrode substrate 10 comprises a light insulating layer 6, a color filter 7, a signal electrode 8, and an aligning film 9. The light insulating layer 6 is composed of a light insulating material on the glass substrate 5. The light insulating layer 6 covers a boundary region of adjacent pixels. The color filter has R, G, and B color cells corresponding to each pixel. The signal electrode 8 functions as a second electrode and is disposed in face of the scanning electrode 2 with a space in such a manner that the signal electrode 8 is perpendicular to the scanning electrode 2. The aligning film 9 covers the nearly entire surface of the substrate including the signal electrode 8. The liquid crystal layer 13 is held in a substrate gap (namely, cell gap) by a sealing material 11 and a spacer 12 disposed between the scanning electrode substrate 4 and the signal electrode substrate 10. The peripheral portion of the liquid crystal layer 13 is sealed with the sealing material 11.

In FIG. 1, for simplicity, several pixels viewed from the peripheral portion of the substrate to which the sealing material 11 is formed is shown. Thus, in a real liquid crystal display apparatus, many pixels are formed.

The glass substrate 1 is a planar glass substrate with outer dimensions of 150 mm (L)×210 mm (W)×1.0 mm (H). Likewise, the glass substrate 5 is a planar glass substrate with outer dimensions of 160 mm (L)×220 mm (W)×1.0 mm (H).

The light insulating layer 6 is a light insulating film that is disposed in the peripheral portion of each pixel and that is formed by dispersing for example a chromium film or black dye that has high light insulating ability into an organic resin film. The light insulating layer 6 insulates the boundary region of adjacent color cells against the light. Each color cell is disposed in a portion surrounded by the pattern of the light insulating layer 6.

In the liquid crystal display apparatus according to the present invention, a coloring material is sprayed to the inside of each pattern of the light insulating layer 6 by an ink jet method. Thus, a color filter is formed. When each color cell is colored by the ink jet method, the pattern of the light insulating layer 6 is used as a self alignment mask. Ultraviolet light is radiated onto the accepting layer. Thus, the ultraviolet light is selectively radiated onto a portion corresponding to each color cell of the accepting layer. Consequently, when coloring materials are sprayed to color cells, the different colors do not blur at the boundary regions of adjacent color cells. As a result, an image with very high color reproducibility can be displayed.

Next, the fabricating method of the liquid crystal display apparatus according to the first embodiment will be described.

A material film of the light insulating layer 6 that has a light insulating ability and is black when viewed directly is formed on the glass substrate 5. The light insulating layer 6 is patterned so that windows are formed corresponding to individual pixel portions.

A color accepting base layer that has a high accepting ability to a coloring material is coated on the nearly entire surface on which the light insulating layer 6 id formed of the substrate 5 by spin coat method.

Ultraviolet light is radiated onto the rear surface side of the substrate surface 5 on which the color accepting base layer is formed. The light insulating layer 6 with the window pattern corresponding to the individual color cells functions as a mask. The ultraviolet light is selectively radiated onto the color accepting base layer corresponding to each color cell.

The color accepting base layer to which the ultraviolet light is radiated is activated. Thus, the color accepting base layer corresponding to each color cell tends to be colored. Coloring materials corresponding to three colors R, G, and B are sprayed to the activated accepting layer by an ink jet unit.

As a material of the accepting layer that is activated by the radiation of ultraviolet light, PVA is preferably used. In this embodiment, the thickness of the accepting layer is 2.0 $\mu$m. The dimensions of one pixel are 100 $\mu$m (W)×300 $\mu$m (L).

As a coloring material, a dye or a pigment that is used for fabricating a color filter by the conventional coloring method or pigment dispersing method. In this embodiment, as coloring materials, C. I. Acid Red 114, C. I. Reactive Green 7, and C. I. Acid Blue 83 (made by Nippon Kayaku) were used.

In such a manner, the coloring materials are sprayed to portions corresponding to color cells on the accepting layer that is activated. Thus, the color filter 7 is formed.

Thereafter, an ITO film is formed on the color filter 7 by sputter method and then etched out. Thus, the signal electrode 8 is patterned.

With the same material as that of the signal electrode 8, a scanning electrode 2 is patterned on the glass substrate 1. The scanning electrode 2 and the signal electrode 8 are disposed perpendicular to each other and a liquid crystal layer is disposed at each intersection thereof so as to form each pixel. These fabricating steps will be performed later.

In this embodiment, 640 signal electrodes 8 and 400 scanning electrodes 2 were formed.

A polyimide thin film is formed on the nearly entire surface side on which signal electrodes 8 and scanning electrodes 2 were formed respectively of the signal electrode substrate 10 and the scanning electrode substrate 4. Thereafter, rubbing aligning process is performed and thereby aligning films 9 and 3 are formed. Since TN type liquid crystal is used as the liquid crystal layer 13, the rubbing process is performed so that the alignment direction of the aligning film 9 is perpendicular to the alignment direction of the aligning film 3.

Thereafter, a sealing material 11 is printed on four sides of the glass substrate 5 except for a liquid crystal filling portion. The sealing material 11 is also used for connecting both the substrates.

To maintain the cell gap, a spacer 12 is applied on the aligning film 9 of the signal electrode substrate 10. The spacer 12 used in this embodiment was Micropearl with a particle diameter of 6.5 $\mu$m (made by Sekisui Fine Chemical).

The aligning films 9 and 3 on both the substrates are faced with a gap. The signal electrode substrate 10 and the scanning electrode substrate 4 are disposed in face of with a gap, in such a manner that the rubbing direction of the aligning film 9 is perpendicular to the rubbing direction of the aligning film 3. The resultant structure is heated so that the sealing material 11 that functions as the bonding agent is hardened and thereby both the substrates are bonded.

After the empty liquid crystal display cells are formed, they are filled with a mixture of ZLI-1565 (made by E. Merk Corporation) and S811 of 0.1 wt % as a liquid crystal material from the filling portion (not shown). The liquid crystal material is held in the liquid crystal display cells as the liquid crystal layer 13. The filling portion is sealed with a sealing material. (not shown). Thus, the liquid crystal display apparatus fabricated by the fabricating method according to the first embodiment of the present invention is accomplished. The sealing material used for the filling portion is for example an ultraviolet light hardening resin.

It should be noted that the selective radiating method of the ultraviolet light according to the present invention is not limited to that of the above-described embodiment.

When the light insulating layer 6 is not used or when the light insulating layer 6 is transparent to the ultraviolet light, the light insulating layer cannot be used as a mask. In this case, with for example an exposing unit, a photomask, and so forth used for LSI fabrication, the ultraviolet light may be selectively radiated onto a portion corresponding to the color cell of each pixel.

Second Embodiment

In a second embodiment, the art of the present invention is applied for an active matrix type liquid crystal display apparatus. A light insulating layer and a color accepting base layer are disposed on an opposite substrate so as to form a color filter on the opposite substrate. With a mask of the light insulating layer, ultraviolet light is radiated onto each pixel portion of the color accepting base layer that is exposed (not masked) and thereby the exposed portion is activated. Electrodes are disposed on the color filter.

Figure 2:
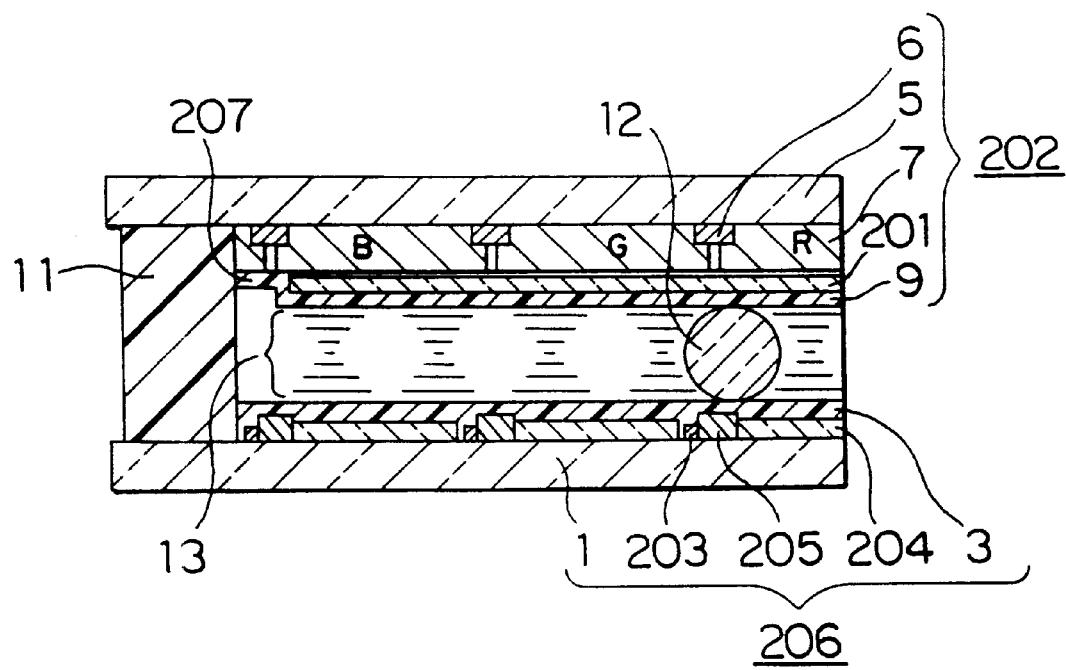
FIG. 2 is a sectional view showing the construction of a liquid crystal display apparatus fabricated by a fabricating method according to a second embodiment of the present invention.

FIG. 2 is a sectional view showing the construction of a liquid crystal display apparatus according to the second embodiment. For simplicity, in FIG. 2, similar portions to those in FIG. 1 are denoted by similar reference numerals.

The liquid crystal display apparatus according to the second embodiment comprises an opposite substrate 202, a TFT array substrate 206, a sealing material 11, a liquid crystal layer 13, and a spacer 12. The opposite substrate 202 comprises a glass substrate 5, a light insulating layer 6, a color filter 7, an opposite electrode 201, and an aligning film 9. The light insulating layer 6 is formed on the glass substrate 5 and has a lattice shaped pattern with window shaped openings corresponding to color cells. The color filter 7 has color cells corresponding to the lattice elements of the light insulating layer 6. The opposite electrode 201 is fully covered on the color filter 7. The aligning film 9 fully covers the opposite electrode 201. The TFT array substrate 206 comprises a glass substrate 1, a scanning line (not shown), a signal line 203, a pixel electrode 204, a TFT 205, and an aligning film 3. The glass substrate 1 is disposed in face of to the opposite substrate 202 with a gap. The scanning-line (not shown) and the signal line 203 are formed on the glass substrate 1. The TFT 205 which is connected to the scanning line, the signal line 203 and the pixel electrode 204, is a switching element that controls the switching of the voltage applied to the pixel electrode 204. The aligning film 3 fully covers the surface of the TFT array substrate 206 on which the signal line 203, the TFT 205, and the pixel electrode 204 are formed. The sealing material 11 seals the peripheral portions of the substrates 202 and 206 and connects them in such a manner that they are faced with a cell gap. The liquid crystal layer 13 is held in the gap between these substrates (cell gap). The peripheral portion of the liquid crystal layer 13 is sealed with the sealing material 11. The spacer 12 maintains the cell gap.

Next, the fabricating process of the liquid crystal display apparatus according to this embodiment will be described.

A laminate of chromium oxide and chromium is formed on a glass substrate 5. By conventional etching method, a window pattern corresponding to each color cell is formed and thereby a light insulating layer 6 is formed as a lattice shaped pattern (namely, a black matrix). A color accepting base layer with a thickness of 2.0 μm is formed on the entire surface of the light insulating layer 6 by roll coat method. The material of the color accepting base layer casein.

Ultraviolet light is radiated onto the rear surface side of the glass substrate 5 surface on which the light insulating layer 6 and so forth are formed. At this point, since the light insulating layer 6 composed of chromium functions as a mask, the ultraviolet light is selectively radiated onto the opening portion corresponding to each pixel of the light insulating layer 6 (namely, the color accepting base layer corresponding to each color cell). In this manner, the color accepting base layer to which the ultraviolet light is radiated is activated.

Coloring materials of three colors R, G, and B are sprayed into the activated accepting layer by an ink jet unit. Thus, the accepting layer is colored and a color filter 7 is formed.

With a roll coater, a over protecting layer 207 with a thickness of 1.2 μm is formed. An ITO film with a thickness of 150 nm is formed on the protecting film 207 by sputter method. The ITO film is the opposite electrode 201 that is a common electrode. In this manner, an opposite substrate 202 is formed.

By conventional TFT forming process, a scanning line (not shown) and a signal line 203 are formed on the glass substrate 1 in such a manner that the scanning line and the signal line 203 are disposed perpendicular to each other on a matrix. A TFT 205 is formed at the intersection of the matrix. A pixel electrode 204 is formed corresponding to each pixel and connected to the TFT 205 so that the voltage applied to the pixel is switched. An aligning film 3 is formed on the nearly entire surface on which the pixel electrode 204 and the TFT 205 are formed. Rubbing aligning process is performed for the surface of the aligning film 3 so as to form a TFT array substrate 206.

An aligning film 9 is formed on the nearly entire surface of the opposite electrode 201 on the opposite substrate 202. Rubbing aligning process is performed on the surface of the aligning film 9 in the direction nearly perpendicular to the rubbing direction of the aligning film 3.

A sealing material 11 is printed along the periphery of the glass substrate 5 of the opposite substrate 202 except for a liquid crystal material filling portion (now shown). With the sealing material 11, the opposite substrate 202 and the TFT array substrate 206 and disposed in face of with a gap, and connected.

A spacer 12 is held in the cell gap of empty liquid crystal display cells so that the cell gap on the screen is equally maintained. The cell gap is filled with a mixture of ZLI-1565 (made by E. Merk Corporation) and S881 of 0.1 wt % as a liquid crystal material from the filling porion (not shown). The filling portion is sealed with an ultraviolet light hardening resin. Thus, a liquid crystal layer 13 is formed. In this manner, the active matrix type liquid crystal display apparatus according to the second embodiment of the present invention is accomplished. In the second embodiment, with the mask of the light insulating layer 6, the ultraviolet light is selectively radiated onto the accenting layer corresponding to each color cell and thereby the radiated portion is hardened. Thus, coloring materials tend to adhere to individual color cells. Consequently, a color filter free of blurring of colors at a boundary region of adjacent color cells can be formed. As a result, the liquid crystal display apparatus with high image color reproducibility and high display quality can be accomplished.

Third Embodiment

In a third embodiment, the art of the present invention is applied for an active matrix type liquid crystal display apparatus. A color accepting base layer is formed on a TFT array substrate. A color filter is formed on the TFT array substrate. A scanning line and a signal line are used as a mask. Each pixel portion of the color accepting base layer that is exposed (not covered by the mask) is activated. Pixel electrodes are disposed on the color filter. After the color filter is formed, a light insulating layer is formed on the TFT array substrate.

Figure 3A:
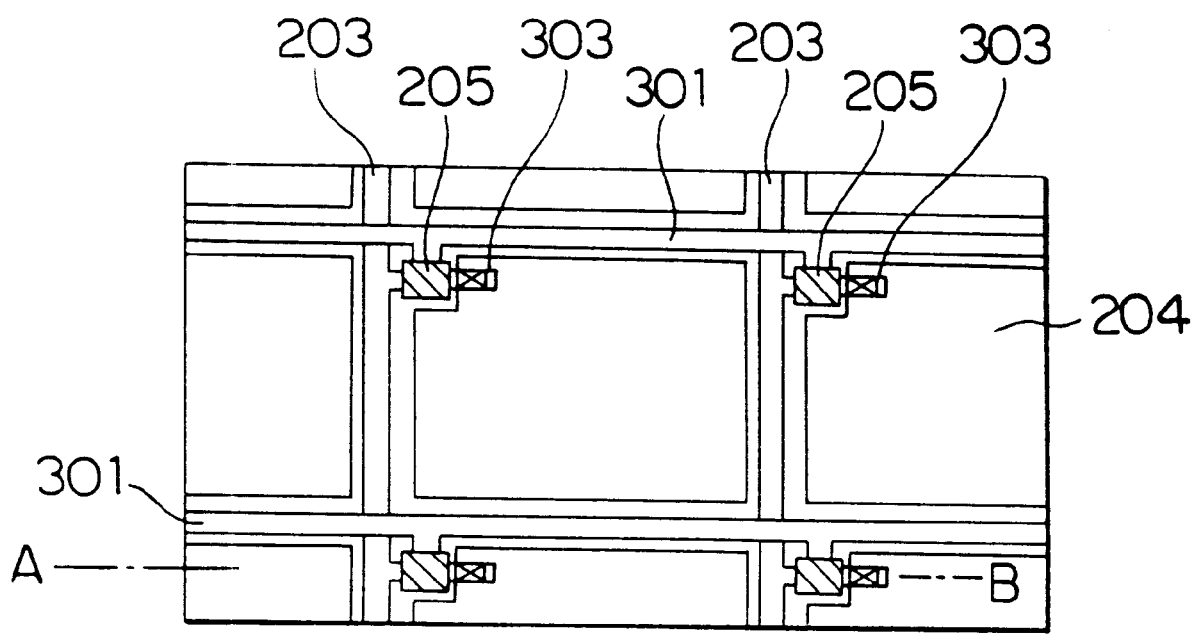
FIG. 3A is a plan view showing the construction of a liquid crystal display apparatus fabricated by a fabricating method according to a third embodiment of the present invention.
Figure 3B:
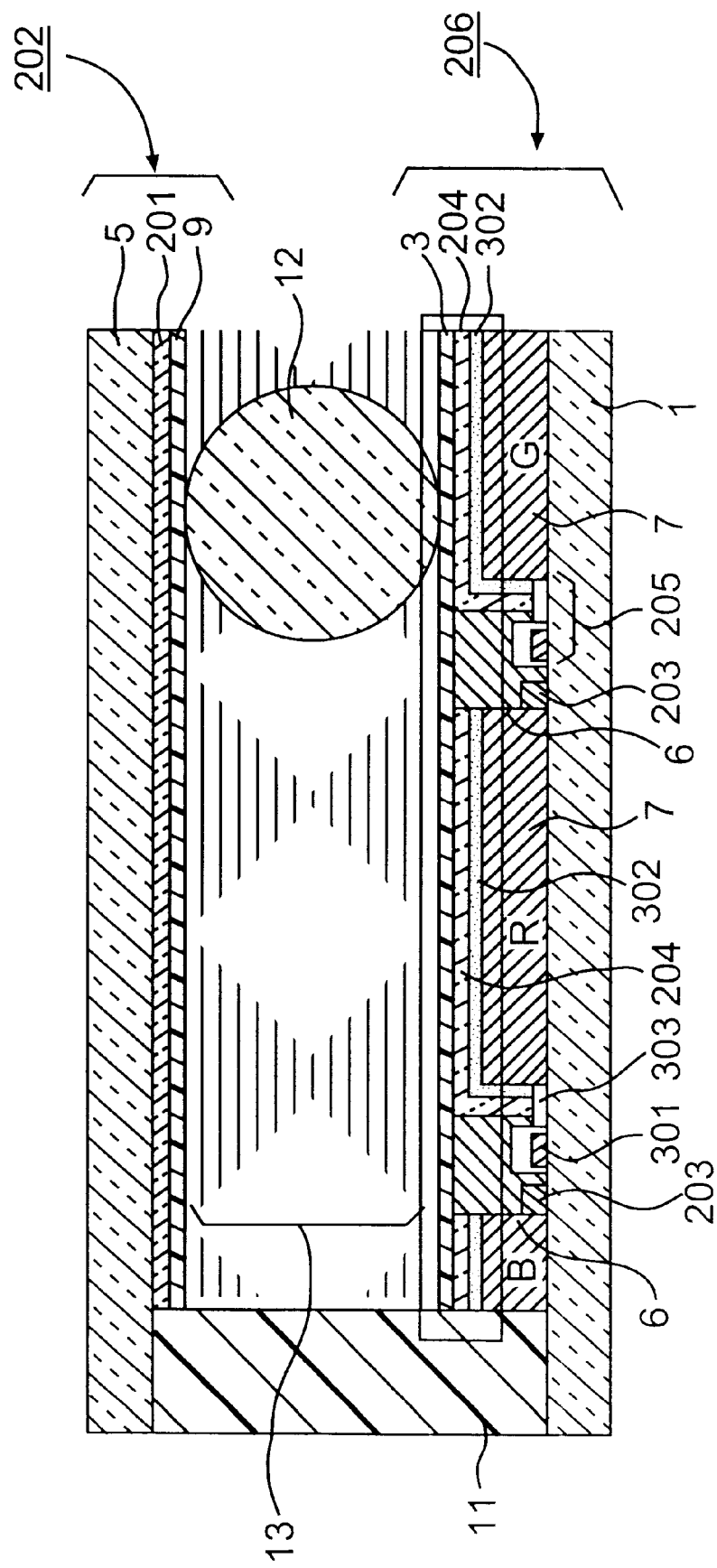
FIG. 3B is a sectional view showing the construction of the liquid crystal display apparatus fabricated by the fabricating method according to the third embodiment of the present invention.

FIG. 3 shows a liquid crystal display apparatus according to the third embodiment of the present invention. FIG. 3A is a plan view showing the liquid crystal display apparatus. FIG. 3B is a sectional view showing the liquid crystal display apparatus.

For simplicity, in FIG. 3, similar portions to those according to the first and second embodiments are denoted by similar reference numerals.

A scanning line 301 and a signal line 203 are disposed in a matrix shape on a glass substrate 1 in such a manner that the scanning line 301 is perpendicular to the signal line 203. A TFT 205 is formed in the vicinity of the intersection of the scanning line 301 and the signal line 203. The TFT 205 is connected to the scanning line 301 and the signal line 203. The TFT 205 can be fabricated by conventional photolithographic method.

A color accepting base layer with a thickness of 2 $\mu$m is formed by roll coat method. Thereafter, ultraviolet light is radiated from the rear surface side of the glass substrate 1 surface on which the TFT 205, the scanning line 301, the signal line 203, and so forth are formed. At this point, since the signal line 203 and the scanning line 301 function as a mask, the ultraviolet light is selectively radiated onto only the exposed portion that is not covered with the signal line 203 and the scanning line 301. Only the portion to which the ultraviolet light is selectively radiated is activated. Thus, coloring materials tends to adhered to the activated portion. This portion becomes an accepting layer.

Thereafter, the coloring materials corresponding to three colors R, G, and B are sprayed to the accepting layer by ink jet method using an ink jet unit. The portion to which the coloring materials are sprayed are colored and thereby a color filter is formed.

The coloring materials corresponding to the three colors are accepted to the accepting portion to which the ultraviolet light is radiated and thereby activated. On the other hand, the boundary region of each color cell is not activated. Thus, the coloring materials are less accessed to the bound region. Consequently, the coloring materials selectively adhere to the individual color cell portions free of blurring of colors at the boundary region of adjacent pixels. As a result, a color filter 7 with high color reproducibility can be formed.

Thereafter, an organic resin film of which a black pigment is dispersed to an organic material is formed on the entire surface of the color filter 7 by roll coat method. Openings corresponding to individual pixels (color cells) are patterned and thereby a light insulating layer 6 with a lattice shaped pattern is formed. The light insulating layer 6 is disposed at the boundary region of adjacent pixels so as to insulate each pixel from the light and to prevent the malfunction of the TFT 205 from photoelectric effect. In addition, to prevent adjacent pixel electrodes 204 from shortcircuiting, the material of the light insulating layer 6 should have a high insulating ability. Thus, the material of the black pigment that composes the light insulating layer 6 should have a high light insulating ability and light absorbing ability free of abnormal color and reflection.

Thereafter, a over protecting layer 302 with a thickness of 1.2 $\mu$m is formed on the nearly entire surface of the TFT array substrate 206 surface on which the TFT 205 and so forth are formed by roll coater.

Next, the pixel electrode 204 that is disposed corresponding to each color cell is formed so as to form each pixel. The pixel electrode 204 is connected to a source electrode 303 of the TFT 205. The pixel electrode 204 is composed of an ITO film with a thickness of 150 nm by sputter method and patterned in an island shape for each pixel region.

Thereafter, an aligning film material is formed on the nearly fully-surface of a over protecting layer 302. Rubbing aligning-process is performed on the surface of the resultant structure and thereby an aligning film 3 is formed.

A transparent conductive film is formed on a glass substrate 5 on an opposite substrate 202. The transparent conductive film is patterned and thereby an opposite electrode 201 is formed. An aligning film 9 is formed on the nearly entire surface of the opposite electrode 201. Rubbing aligning process is performed on the surface of the aligning film 9 and thereby an opposite substrate 202 is formed.

Thereafter, a sealing material 11 that also functions as a bonding agent is printed along the peripheral portion of the glass substrate 5 of the opposite substrate 202 except for a liquid crystal material filling portion (not shown).

The opposite substrate 202 and the TFT array substrate 206 are faced with a cell gap through the sealing material 11. Both the substrates 202 and 206 are heated and pressured so as to connect these substrates 202 and 206. To maintain the planar equality of the cell gap, the cell gap between the substrates is maintained by a spacer 12. As an example of the spacer 12, Micropearl with a particle diameter of 6 $\mu$m (made by Sekisui Fine Chemical) is coated.

The cell gap of blank liquid crystal display cells is filled with a liquid crystal material. As a material of the liquid crystal material, a mixture of ZLI-1565 (made by E. Merk Corporation) and S811 of 0.1 wt % was used. The liquid crystal material is filled from the filling portion. Thereafter, the filling portion is sealed with an ultraviolet light hardening resin. Thus, the liquid crystal display apparatus according to the third embodiment of the present invention is accomplished.

As a result, the art of the present invention can be effectively applied for the liquid crystal display apparatus having the color filter disposed on the TFT array substrate.

Fourth Embodiment

In a fourth embodiment, the art of the present invention is applied for an active matrix type liquid crystal display apparatus. A color accepting base layer is disposed on a TFT array substrate. A color filter is formed on the TFT array substrate. A scanning line and a signal line are used as a mask. Ultraviolet light is radiated onto each pixel portion of the color accepting base layer that is exposed (not covered by the mask) and the radiated portion is hardened. The non-hardened portion is removed with a solvent. An accepting layer is patterned at only a required portion. A pixel electrode is disposed on a color filter. After the color filter is formed, a light insulating layer is formed on the TFT array substrate.

Figure 4:
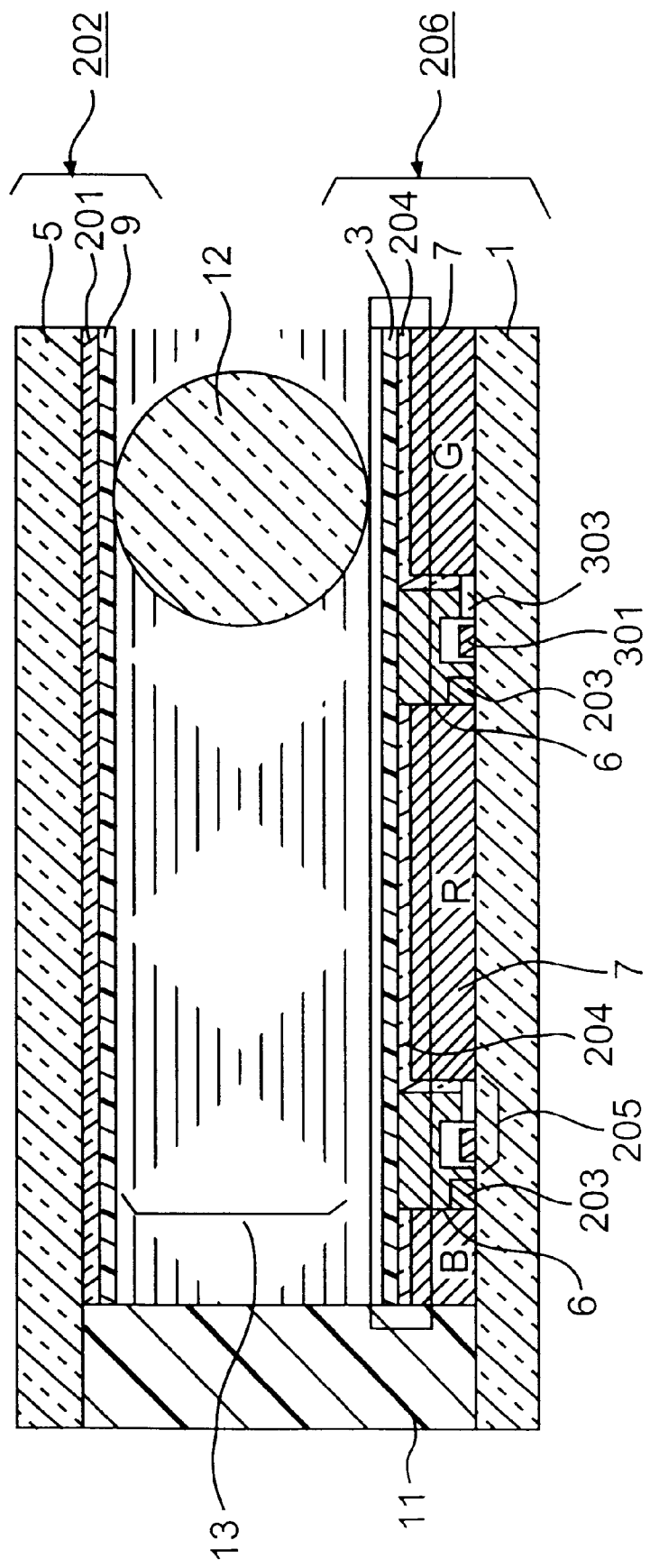
FIG. 4 is a sectional view showing the construction of a liquid crystal display apparatus fabricated by a fabricating method according to a fourth embodiment of the present invention.
Figure 5:
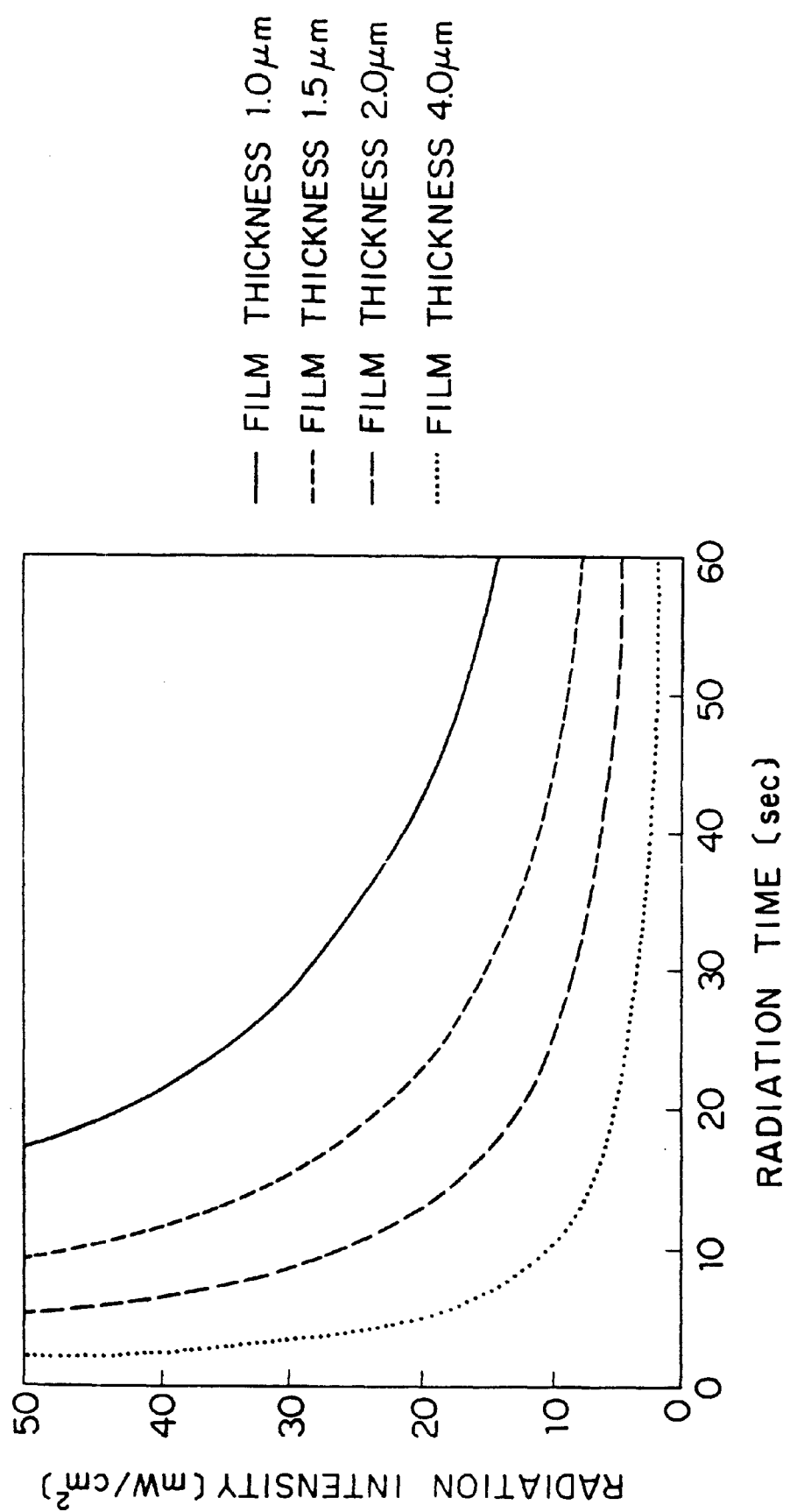
FIG. 5 is a graph showing the relation between radiation intensity and radiation time of ultraviolet light of the fabricating method according to the present invention.

FIG. 4 is a sectional view showing the construction of a liquid crystal display apparatus fabricated according to a fourth embodiment of the present invention. For simplicity, in FIG. 4, similar portions to those according to the third embodiment are denoted by similar reference numerals.

A scanning line 301 and a signal line 203 disposed perpendicular thereto are formed on a glass substrate 1 in a matrix shape. A TFT 205 is formed in the vicinity of the intersection of the scanning line 301 and the signal line in such a manner that the TFT 205 is connected to the scanning line 301 and the signal line 203. The TFT 205 can be formed by conventional photolithographic fabricating method.

Thereafter, a color accepting base layer is formed. As an material of the color accepting base layer, unlike with the first to third embodiments, an ultraviolet light hardening resin of a radical polymerized acrylate type or the like is used. The material of the ultraviolet light hardening resin preferably has a high color adhering ability against a coloring material of a color filter. In addition, the material preferably has properties of which a portion to which ultraviolet light is radiated is hardened and a portion to which ultraviolet light is not radiated is easily removed with a solvent or the like.

Examples of the ultraviolet light-hardening resin are a mixture as a photosensitive solution of natural protein base and dichromate acid, a mixture of acrylic resin, epoxy denatured acrylic resin, or PVA with a photosensitive property.

The color accepting base layer is formed by coating an ultraviolet light hardening resin film with a thickness of 2 µm by roll coat method.

Thereafter, ultraviolet light is radiated to the ultraviolet light hardening resin layer from the rear surface side of the glass substrate 1 surface on which the scanning lines 301, the signal lines 203, and so forth are formed. At this point, the signal line 203 and the scanning line 301 function as a mask against the ultraviolet light. Thus, the ultraviolet light is selectively radiated onto only the exposed portion that is not covered with the signal line 203 and the scanning line 301. Only the portion to which the ultraviolet light is selectively radiated is hardened and thereby not dissolved with a solvent. The boundary region of adjacent pixels to which the ultraviolet light is not radiated and not hardened can be removed with a solvent. Thus, an accepting layer in an island shape corresponding to each pixel is formed.

Thereafter, coloring materials corresponding to three colors R, G, and B are sprayed onto the accepting layer by an ink jet unit and thereby a color filter is formed.

At this point, the coloring materials corresponding to the three colors are accepted to the accepting layer in the island shape corresponding to the color cells whose boundary region is etched out. On the other hand, since the accepting layer is not present at the boundary region of the pixels, these portions are not colored. Thus, each color cell can be selectively colored free of blurring of colors at the boundary region of adjacent pixels. Consequently, a color filter 7 with high color reproducibility can be formed.

Thereafter, a pixel electrode 204 is formed corresponding to a position corresponding to each pixel so that it is connected to the source electrode 303 of the TFT 205. An ITO film with a thickness of 150 nm is formed by sputter method and patterned in an island shape for each pixel.

Thereafter, an organic resin film of which a black pigment is dispersed to an organic material is formed on the color filter 7 and the pixel electrode 204 by roll coat method. A window pattern is formed corresponding to each pixel (color cell) and thereby a lattice shaped light insulating layer 6 is formed.

Thereafter, an aligning film material is formed on the nearly entire surface of the TFT array substrate 206 on which the pixel electrode 204 and the so forth are formed. Rubbing aligning process is performed for the surface of the resultant structure and thereby an aligning film 3 is formed.

A transparent conductive film is formed on a glass substrate 5 of an opposite substrate 202 and thereby an opposite electrode 201 is formed. An aligning film 9 is formed on the nearly entire surface of the opposite electrode 201. Rubbing aligning process is performed for the surface of the aligning film 9 and thereby an opposite substrate 202 is formed.

Thereafter, a sealing material 11 that also functions as a bonding agent is printed along the peripheral portion of the glass substrate 5 of the opposite substrate 202 except for a liquid crystal material filling portion (not shown).

The opposite substrate 202 and the TFT array substrate 206 are faced with a cell gap through the sealing material 11. The resultant structure is heated and pressured so as to connect both the substrates. At this points to maintain the planar equality of the cell gap; a spacer 12 is held in the cell gap of both the substrates. As a material of the spacer 12, Micropearl with a particle diameter of 6 µm (made by Sekisui Fine Chemical) is coated.

The cell gap of empty liquid crystal display cells is filled with a liquid crystal material through the filling portion., The liquid crystal material is a mixture of ZLI-1565 (made by E. Merk Corporation) and S811 of 0.1 wt %. Thereafter, the filling portion is sealed with an ultraviolet light hardening resin. Thus, the liquid crystal display apparatus according to the fourth embodiment is accomplished.

Thus, according to the fifth embodiment of the present invention, the liquid crystal display apparatus with the color filter free of blurring of colors at the boundary region of adjacent color cells (pixels) can be fabricated.

Fifth Embodiment

In a fifth embodiment, a pixel electrode is formed on a glass substrate before a color filter is formed. The color filter is disposed on the pixel electrode. With a photomask having an opening portion patterned corresponding to each pixel portion, ultraviolet light is radiated onto a color accepting base layer exposed from the opening portion (not covered with the light insulating pattern). The radiated portion is activated and thereby an accepting portion is formed.

Figure 6:
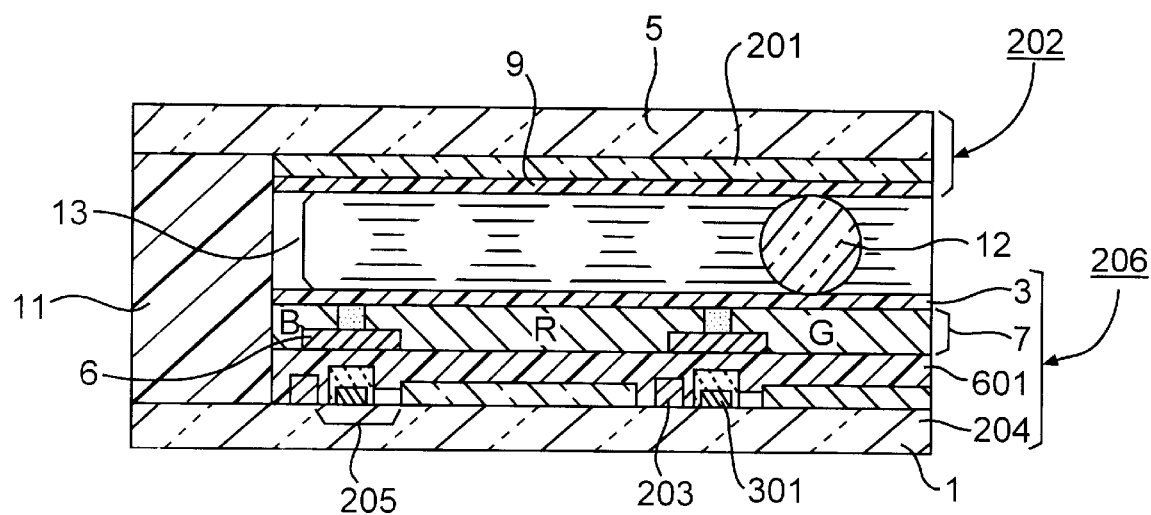
FIG. 6 is a sectional view showing the construction of a liquid crystal display apparatus fabricated by a fabricating method according to a fifth embodiment of the present invention.
Figure 7:
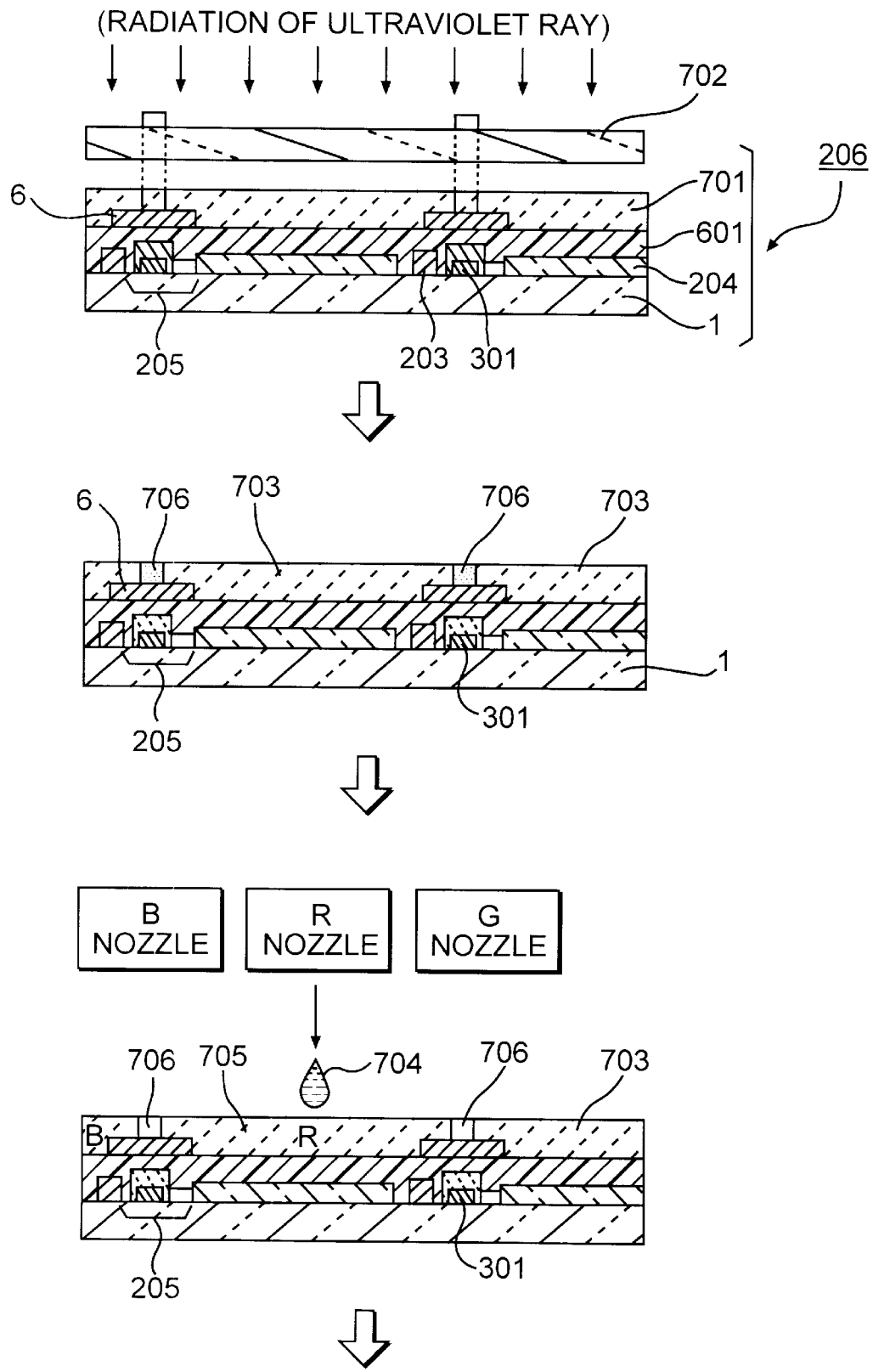
FIG. 7 shows a fabricating process of the liquid crystal display apparatus according to the fifth embodiment.
Figure 8:
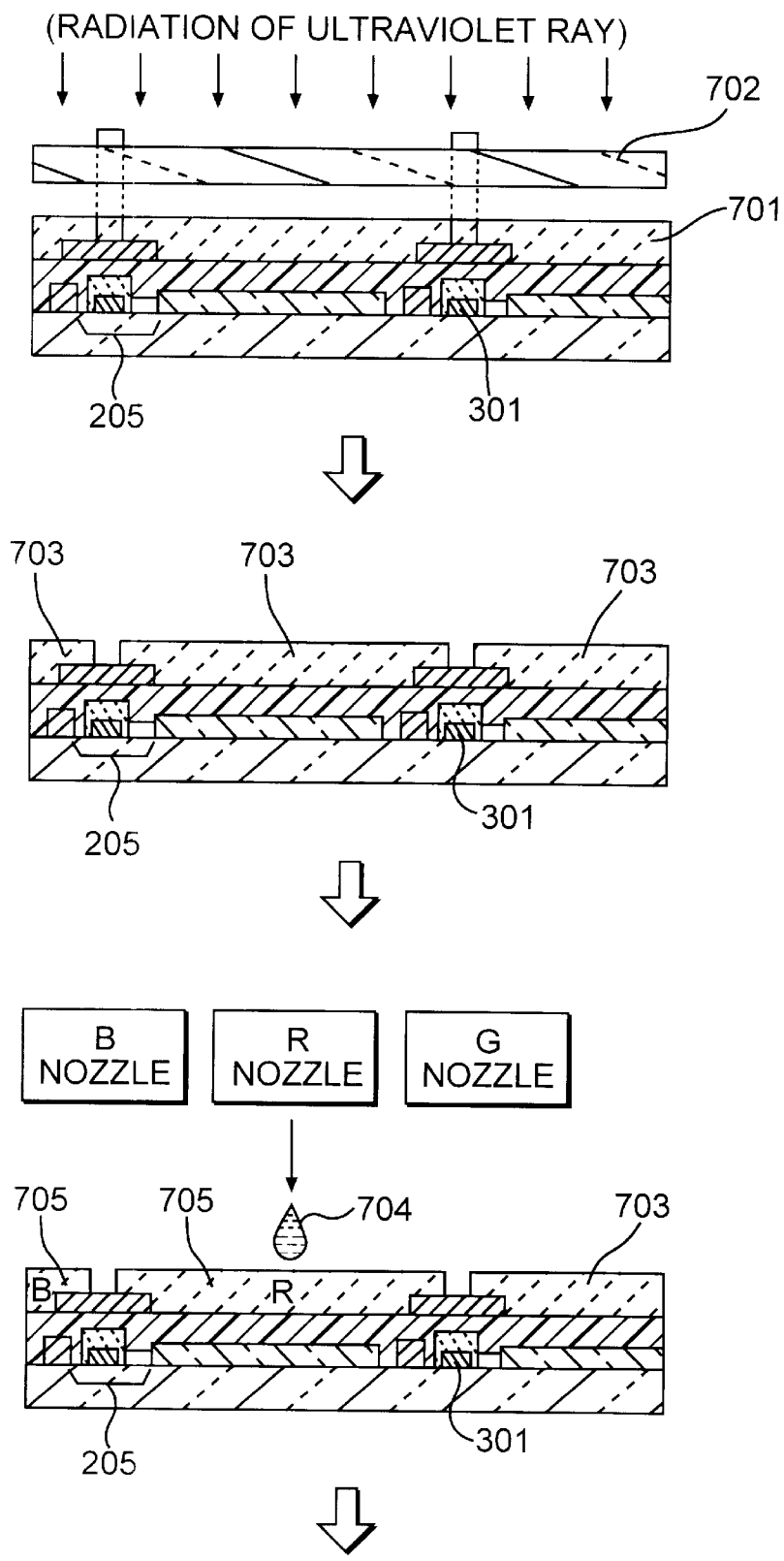
FIG. 8 shows a fabricating process of the liquid crystal display apparatus according to the fifth embodiment.

FIG. 6 is a sectional view showing the construction of a liquid crystal display apparatus fabricated according to a fifth embodiment of the present invention. FIGS. 7 and 8 show fabrication process of the liquid crystal display apparatus shown in FIG. 6. For simplicity, in FIGS. 6, 7, and 8, similar portions to those according to the second to fourth embodiments are denoted by similar reference numerals.

A scanning line 301 and a signal line 203 disposed perpendicular thereto are formed on a glass substrate 1 in a matrix shape. A TFT 205 is formed in the vicinity of the intersection of the scanning line 301 and the signal line 203 in such a manner that the TFT 205 is connected to the scanning line 301 and the signal line 203. The TFT 205 can be formed by conventional photolithographic fabricating method. By sputter method, an ITO film with a thickness of 150 nm is formed. A pixel electrode 204 is formed in an island shape pattern corresponding to each pixel.

An inter-layer insulating film 601 is formed on the nearly entire surface of the glass substrate 1 on which the scanning line 301, the signal line 203, and the TFT 205 are formed.

Thereafter, an organic resin film of which a black pigment is dispersed to an organic material is formed on the entire surface of the inter-layer insulating film 601 by roll coat method. An opening portion (window pattern) corresponding to each pixel (color cell) is formed and thereby an insulating layer 6 in a lattice shape is formed. The light insulating layer 6 may be disposed on the opposite substrate or on a layer below the TFT 205 and the pixel electrode 204 (a layer close to the glass substrate 1).

Thereafter, as shown in FIG. 7 (1st step), a color accepting base layer 701 with a thickness of 2 µm is formed by roll coat method. Ultraviolet light is radiated from the surface side of the glass substrate 1 on which the TFT 205, the scanning line 301, the signal line 203, and so forth are formed through a photomask 702.

At this point, a light insulating pattern that covers the TFT 205 and non-pixel portion is formed on the photomask 702. Thus, the ultraviolet light is selectively radiated onto only the color accepting base layer 701 that is exposed, not covered by the light insulating pattern. The radiated portion is activated and an accepting layer 703 is formed as shown in FIG. 7 (2nd step).

Thereafter, as shown in FIG. 7 (3rd step), coloring materials 704 corresponding to three colors R, G, and B are sprayed to the accepting layer 703 by an ink jet method using an ink jet unit. Thus, a portion to which the coloring materials 704 are sprayed is colored and a color filter 7 is formed.

At this point, the coloring materials 704 corresponding to these colors are effectively accepted to the accepting layer 703 corresponding to color cells 705 activated by the radiation of the ultraviolet light. On the other hand, since a boundary region 706 of adjacent color cells 705 is not activated, the coloring materials are less or hardly accepted to the boundary region. Thus, the coloring materials 704 can be selectively sprayed to the portions corresponding to the color cells 705 free of blurring of colors at the boundary region of the adjacent pixels. Thus, a color filter 7 with high color reproducibility can be formed.

Thereafter, an aligning film material is formed on the nearly entire surface of a TFT array substrate 206. Rubbing aligning process is performed for the surface of the resultant structure and thereby an aligning film 3 is formed.

A transparent conductive film is formed on a glass substrate 5 of an opposite substrate 202. The transparent conductive film is patterned and thereby an opposite electrode 201 is formed. The transparent conductive film is formed on the nearly entire surface of the opposite electrode 201. Rubbing aligning process is performed for the surface of the aligning film 9 and thereby the opposite substrate 202 is formed.

Thereafter, a sealing material 11 that also functions as a bonding agent is printed on the peripheral portion of the glass substrate 5 of the opposite substrate 202 is printed except for a liquid crystal material filling portion (not shown). The opposite substrate 202 and the TFT array substrate 206 are faced with a gap through a sealing material 11. The resultant structure is heated and pressured and thereby they are connected. At this point, to maintain the planar equality of the cell gap, a spacer 12 is held in the cell gap between both the substrates. As a material of the spacer 12, Micropearl with a particle diameter of 6 μm (made by Sekisui Fine Chemical) is coated.

The cell gap of empty liquid crystal display cells is filled with a liquid crystal material that a mixture of ZLI-1565 (made by E. Merk Corporation) and S811 of 0.1 wt % from the filling portion. Thereafter, the filling portion is sealed with an ultraviolet light hardening resin. Thus, the liquid crystal display apparatus according to the fifth embodiment of the present invention is accomplished.

As shown in FIG. 8, the color accepting base layer 701 is formed of an ultraviolet light hardening resin (see FIG. 8 (1st step)). Likewise, ultraviolet light is radiated to the color accepting base layer formed of the ultraviolet light hardening resin. Thus, the portion to be colored corresponding to each pixel (namely, the portion of the color cell 705) is hardened and left. On the other hand, the boundary region 706 that is not required is removed with a solvent or the like. As a result, the accepting layer 703 is formed for only the portion of a color cell 706 corresponding to each pixel (FIG. 8 (2nd step)). The accepting layer 703 is colored (see FIG. 8 (3rd step)).

In the fabricating method according to the fifth embodiment, as in the third embodiment, even if the rear surface exposure to the color accepting base layer is difficult, the ultraviolet light can be selectively radiated in any pattern with high accuracy. For example, when a pixel electrode is formed of a material that is lesser transparent to the ultraviolet light such as ITO on a layer lower than a color filter, the rear surface exposure to the color accepting base layer through the electrode pixel may become difficult as in the third embodiment. However, as in the fifth embodiment, when the front surface exposure is performed, such a problem can be solved. When color cells of the color filter are formed at a portion insulated by a light insulating layer, a scanning line, a signal line, a TFT, and the like, ultraviolet light is selectively radiated onto any position of the color accepting base layer by the fabricating method according to the fifth embodiment. Thus, a color filter with a required pattern of color cells free of blurring of colors can be formed.

In this embodiment, the pixel electrode 204 is formed on a layer below the color filter 7. However, the pixel electrodes may be formed on a layer above the color filter 7.

The fabricating method of the color filter of the liquid crystal display apparatus according to the fifth embodiment can be applied for not only the fabricating method of the active matrix type liquid crystal display apparatus, but also the fabricating method of the simple matrix type liquid crystal display apparatus.

Sixth Embodiment

In a sixth embodiment, by coloring a predetermined position of a color accepting base layer with a black dye, not only a color filter, but also a light insulating layer are formed. Ultraviolet light is selectively radiated to each pixel portion of the color accepting base layer with a photomask.

Figure 9:
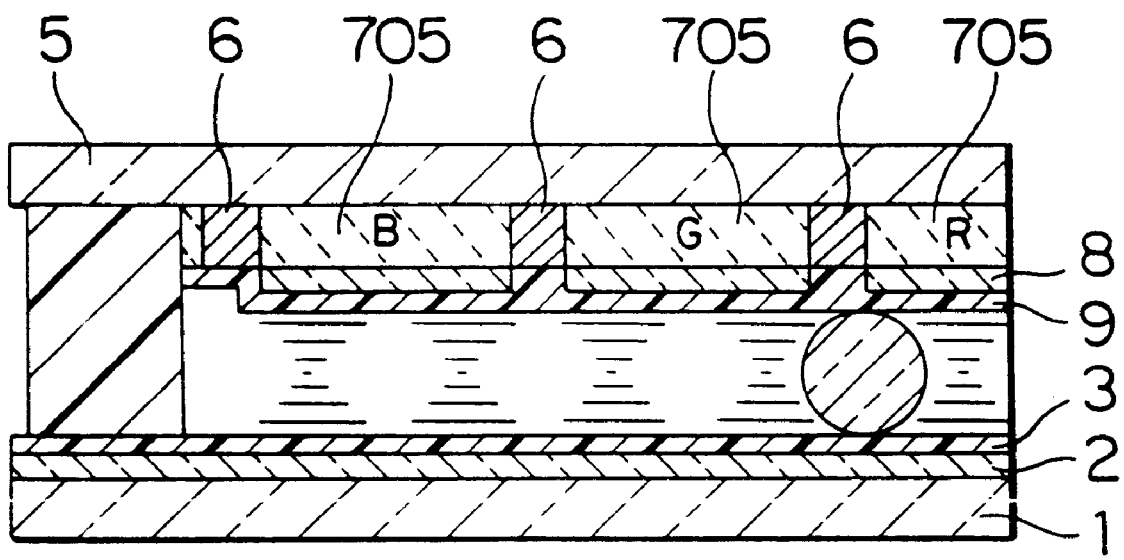
FIG. 9 is a sectional view showing a liquid crystal display apparatus fabricated by a fabricating method according to a sixth embodiment.
Figure 10:
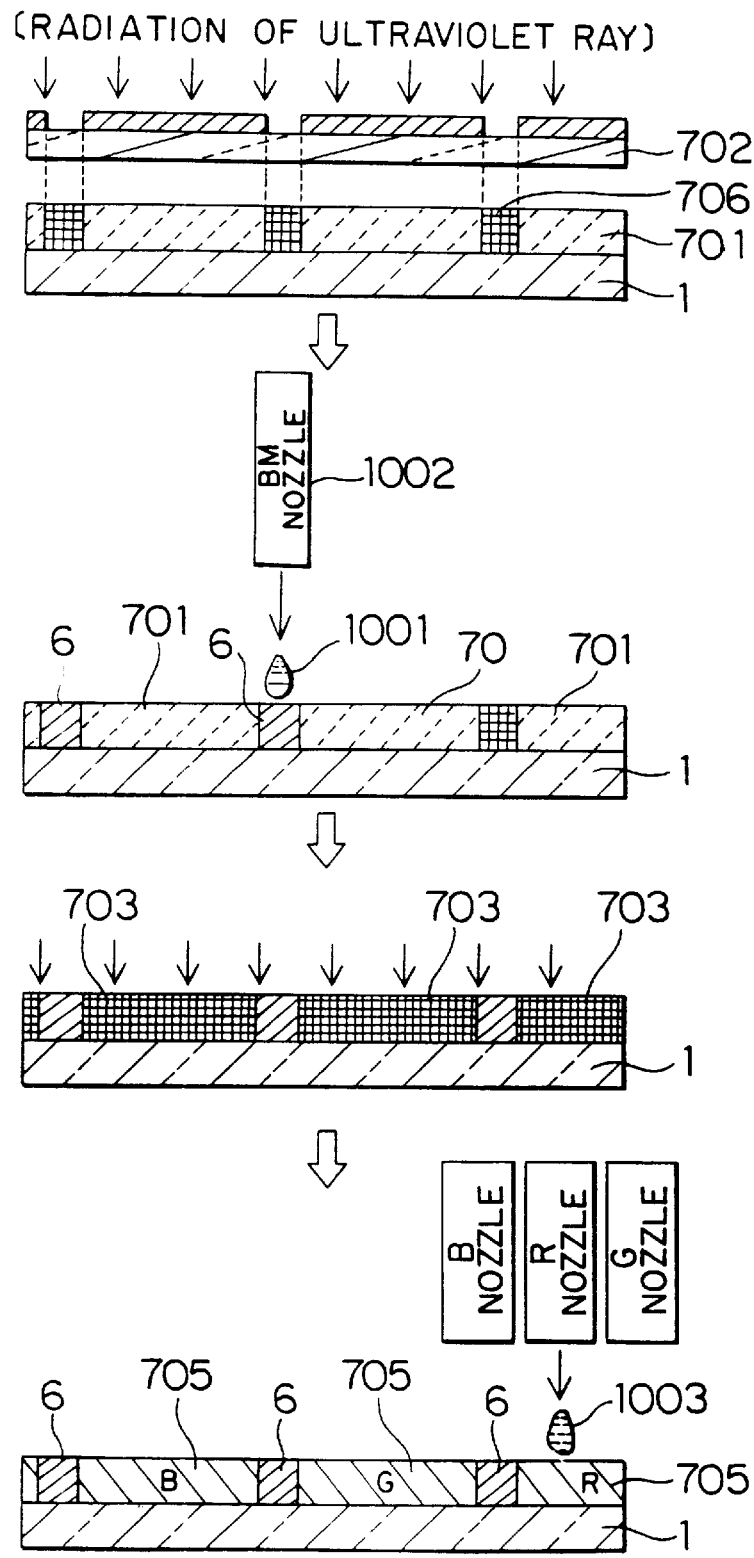
FIG. 10 shows a fabricating process of the liquid crystal display apparatus according to the sixth embodiment.

FIG. 9 is a sectional view showing the construction of a liquid crystal display apparatus fabricated by a fabricating method according to a sixth embodiment of the present invention. FIG. 10 shows fabricating process according to the sixth embodiment. For simplicity, in FIGS. 9 and 10, similar portions to those according to the first to fifth embodiments are denoted by similar reference numerals.

The liquid crystal display apparatus according to the sixth embodiment is similar to the liquid crystal display apparatus according to the first embodiment. Particularly, in the sixth embodiment, an accepting layer 706 is colored corresponding to a light insulating layer 6 and formed on the same layer as a color filter 7.

In other words, the liquid crystal display apparatus according to the sixth embodiment comprises a scanning electrode substrate 4, a signal electrode substrate 10, and a liquid crystal layer 13. The scanning electrode substrate 4 comprises a glass substrate 1, a scanning electrode 2, and an aligning film 3. The scanning electrode 2 that is a first electrode is formed on the glass substrate 1. The aligning film 3 is formed on the nearly entire surface of the scanning electrode 2. The signal electrode substrate 10 comprises a glass substrate 5, a light insulating layer 6; a color filter 7, a signal electrode 8, an aligning film 9, a signal electrode substrate 10, a sealing material 11, a spacer 12, and a liquid crystal layer 13. The light insulating layer 6 is formed by coloring the accepting layer with a black dye or pigment so that the light insulating layer 6 covers the boarder portions of adjacent pixels. On the same layer as the light insulating layer 6, the color filter 7 having color cells R, G, and B corresponding to individual pixel portions is formed. The signal electrode 8 that is a second electrode is formed on the color filter so that the signal electrode 8 is disposed nearly perpendicular to the scanning electrode 2 with a gap thereto. The aligning film 9 is formed on the nearly entire surface of the resultant structure including the signal electrode 8. The scanning electrode substrate 4 and the signal electrode substrate 10 are held by the sealing material 11 and the spacer 12. The gap between the substrates (namely, the cell gap) is filled with the liquid crystal layer 13. The peripheral portions of the cell gap are sealed with the sealing material 11.

The glass substrate 1 is a planar glass substrate with outer dimensions of 150 mm (W)×210 mm (L)×1.0 mm (H). The glass substrate 5 is a planar glass substrate with outer dimensions of 160 mm (W)×220 mm (L)×1.0 mm (H).

A light insulating layer 6 is formed by coloring an accepting layer 706 so as to insulate the boundary region of adjacent pixels (color cells) against the light. The accepting layer 703 is colored so that each color cell 705 is placed in each lattice element surrounded by the pattern of the light insulating layer 6.

In the liquid crystal display apparatus according to this embodiment, ultraviolet light is radiated onto not only the color accepting base layer 701 corresponding to the color filter 7, but also the color accepting base layer 701 corresponding to the light insulating layer 6 with a photomask 702 and thereby an accepting layer 706 is formed (see FIG. 10 (1st step)). A black coloring material 1001 is sprayed to the accepting layer 706 by ink jet method using an ink jet unit 1002 so as to form a light insulating layer 6 (see FIG. 10 (2nd step)).

Thereafter, by radiating ultraviolet light onto the portion corresponding to each color cell that is left as the color accepting base layer 701, an accepting layer 703 that accepts the coloring material for the color filter corresponding to each color cell is formed (see FIG. 10 (3rd step)).

A coloring material 1003 corresponding to each color is sprayed to the accepting layer 703 by an ink jet unit 1004 and thereby a color filter 7 is formed (see FIG. 10 (4th step)).

Since the light insulating layer 6 is formed at the boundary region of adjacent color cells 705, the light insulating layer 6 can prevent colors from blurring. Thus, an image with high color reproducibility is accomplished.

Seventh Embodiment

In a seventh embodiment, after a color filter is formed, a photosensitive resin material film in which a black dye or pigment is added is formed on the resultant substrate. With a mask of the color filter, the photosensitive resin material filter is exposed and developed so as to form a light insulating layer.

Thus, it is logically clear that the fabricating method according to the seventh embodiment can be applied for any fabricating method of the liquid crystal display apparatus as long as a color filter is formed by the ink jet method according to the present invention before a light insulating layer is formed. Thus, in the seventh embodiment, for simplicity, the description of the constructions of the liquid crystal display apparatus and the color filter and the fabricating methods thereof are omitted. Only the forming process of the light insulating layer after the forming process of the color filter will be described.

Figure 11:
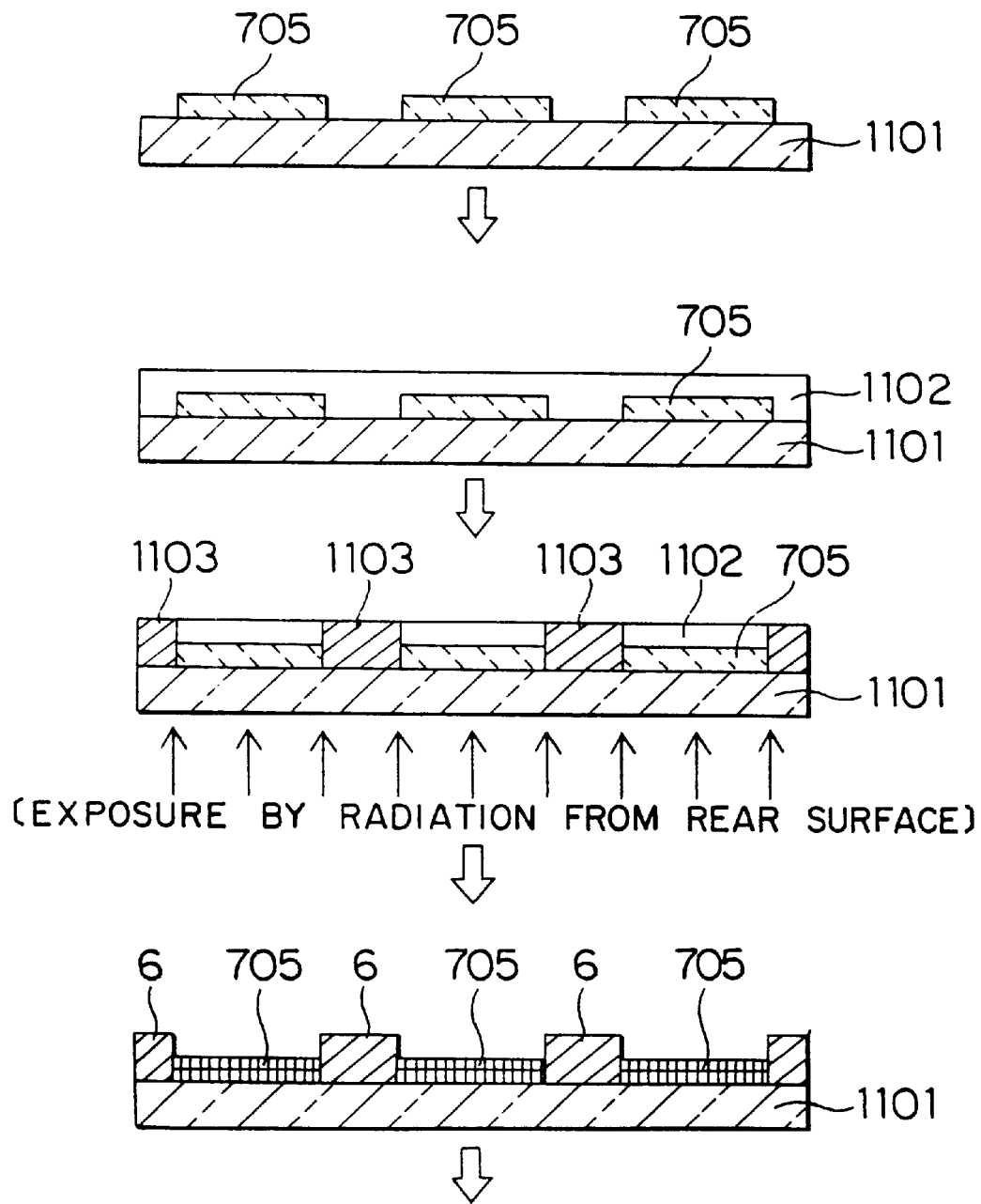
FIG. 11 shows a fabricating process of a liquid crystal display apparatus according to a seventh embodiment.

FIG. 11 shows fabricating method according to this embodiment. For simplicity, in FIG. 11, similar portions to those according to the first to sixth embodiments are denoted by similar reference numerals.

An accepting layer 703 is colored and each color cell 705 for a color filter 7 is formed on a substrate 1101 (see FIG. 11 (1st step)). A photosensitive resin material film 1102 of which a block pigment is added or dispersed to an acrylic ultraviolet light hardening resin is coated on the nearly entire surface of the substrate 1101 by for example a spin coater device (see FIG. 11 (2nd step)).

Thereafter, ultraviolet light is radiated from the rear surface side of the the substrate 1101 surface on which the each color cell 705 for the color filter 7 is formed. The color cell 705 for the color filter 7 functions as a mask so as to absorb and partly reflect the ultraviolet light. Thus, the ultraviolet light is not satisfactorily radiated onto the photosensitive resin material overlapped with the color cell 705 and thereby this portion is not hardened. On the other hand, the ultraviolet light is satisfactorily radiated onto the photosensitive resin material film 1103 at the boundary region of adjacent color cells 705 (namely, non-pixel portion) and thereby this portion is hardened. The non-hardened portion has a resistance to a developing solution that develops the acrylic ultraviolet light hardening resin (or to a solvent) (see FIG. 11 (3rd step)).

With a developing solution or a solvent, the exposed photosensitive resin material film 1103 (and the non-exposed photosensitive resin material film 1102) is developed or removed. Thus, a light insulating layer 6 that insulates the boundary region of adjacent color cells 705 (namely, the non-pixel portion) against the light can be formed (see FIG. 11 (4th step)).

The substrate 1101 may be constructed by forming a color filter on a glass substrate. Alternatively, the substrate 1101 may be a TFT array substrate on which for example a scanning line, a signal line, a TFT, a pixel electrode, and so forth are formed. As another alternative construction, the substrate 1101 may be an electrode substrate on which an electrode such as a scanning electrode for a simple matrix type liquid display apparatus is formed.

In this embodiment, the photosensitive resin material film 1102 of which a black pigment is added or dispersed to the acrylic ultraviolet light hardening resin is used. Alternatively, a photosensitive resin material film of which a black dye is added to a photosensitive resin film as a conventional photoresist or a photosensitive resin material that is photosensitive to other than ultraviolet light may be used.

Eighth Embodiment

In an eighth embodiment, ultraviolet light is radiated onto a color accepting base layer. A required portion is hardened and a not-required portion is removed so as to form an accepting layer. A photosensitive resin material film in which a black dye or pigment is added is formed on the resultant substrate. With a mask of the accepting layer, the photosensitive resin material film is exposed and developed so as to form a light insulating layer. At this point, the thickness of the light insulating layer is larger than the thickness of the color filter. Thus, the light insulating layer prevents colors of the adjacent color cells from blurring.

Consequently, it is logically clear that the fabricating method according to the seventh embodiment can be applied for any fabricating method of the liquid crystal display apparatus as long as a color filter is formed by the ink jet method according to the present invention before a light insulating layer is formed. Thus, in this embodiment, for simplicity, the description of the liquid crystal display apparatus and the color filter and the fabricating methods thereof are omitted. Only the fabricating process of the light insulating layer after the fabricating process of the accepting layer will be described.

Figure 12:
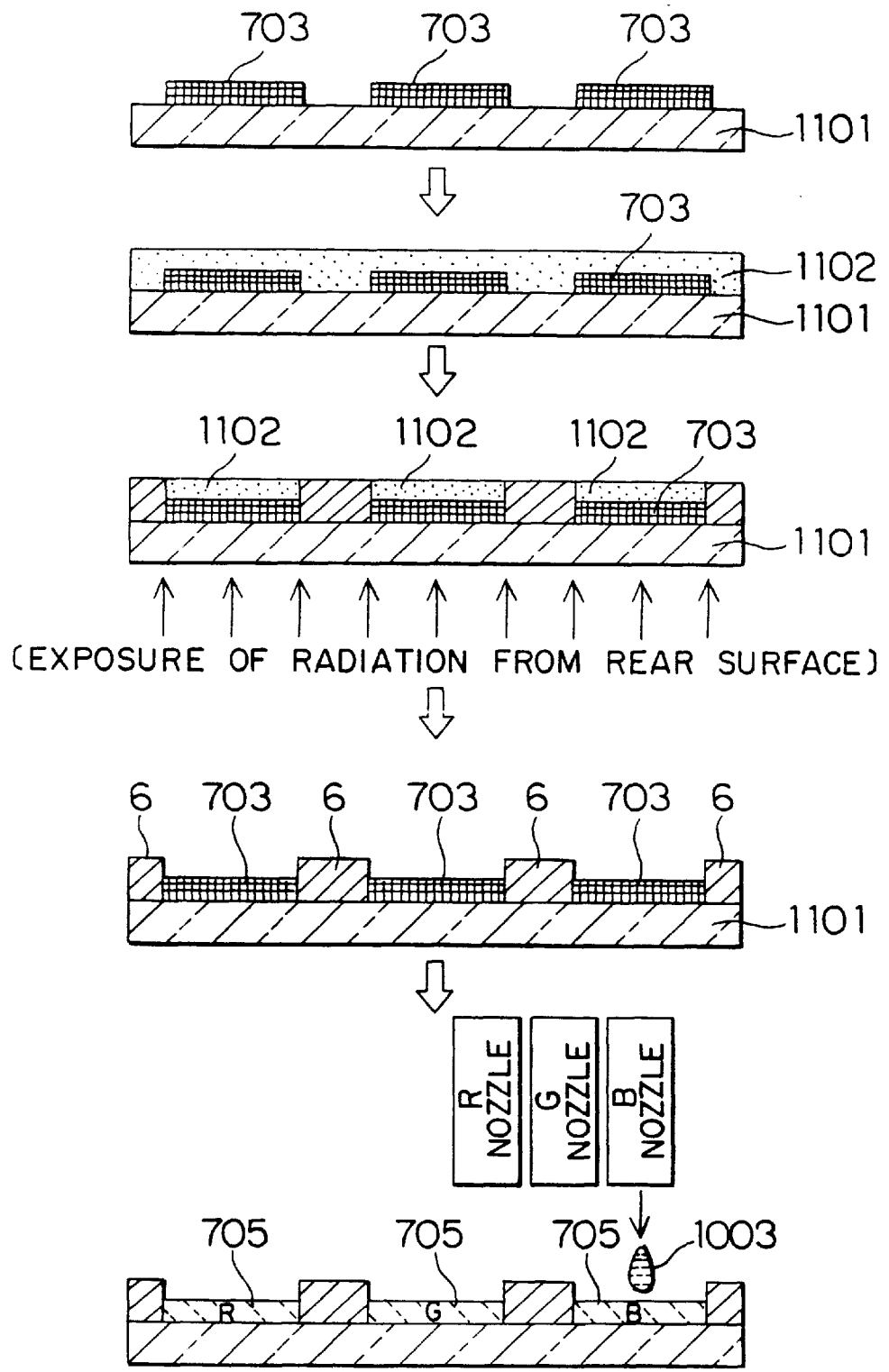
FIG. 12 shows a fabricating process of a liquid crystal display apparatus according to an eighth embodiment.

FIG. 12 shows fabricating method according to this embodiment. For simplicity, in FIG. 12, similar portions to those according to the first to seventh embodiments are denoted by similar reference numerals.

A photosensitive resin material film 1102 of which a black pigment is added or dispersed to an acrylic ultraviolet light hardening resin is coated on the nearly entire surface of a substrate 1101 on which an accepting layer 703 is formed in a film shape by for example a spin coater device (see FIG. 12 (1st and 2nd step)).

Thereafter, ultraviolet light is radiated from the rear surface side of the the substrate 1101 surface on which the accepting layer 703 is formed (see FIG. 11 (3rd step)). At this point, the accepting layer 703 that functions as a mask absorbs and partially reflects the ultraviolet light. Thus, the ultraviolet light is not satisfactorily radiated onto the photosensitive resin material film 1102 that overlaps with the accepting layer 703. On the other hand, ultraviolet light is satisfactorily radiated onto the photosensitive resin material film 1103 on which the accepting layer 703 is not formed (namely, the non-pixel portion) and thereby this portion is hardened. Thus, this portion has a resistance to a developing solution that develops the acrylic ultraviolet light hardening resin (or to a solvent). At this point, since ultraviolet light is also radiated from the rear surface of the accepting layer 703, the rear surface of the accepting layer 703 is further hardened. In addition, the coloring ability of the rear surface is further improved.

The exposed photosensitive resin material film 1102 is developed with a developing solution (or a solvent) (or the non-required portion is dissolved and removed). Thus, the light insulating layer 6 that insulates the boundary region (namely, the non-pixel portion) of the accepting layer 703 against the light can be formed (see FIG. 11 (4th step)).

Thereafter, a coloring material 1003 is sprayed to the exposed accepting layer 703 on which the photosensitive resin material film 1102 is removed. Thus, a color cell 705 is formed and thereby a color filter 7 is accomplished (see FIG. 11 (5th step)).

The substrate 1101 may be a substrate of which an accepting layer 703 is formed on a glass substrate. Alternatively, the substrate 1101 may be a TFT array substrate on which a scanning line, a signal line, a TFT, a pixel electrode, and so forth are formed. As another alternative construction, the substrate 1101 may be an electrode substrate on which an electrode is formed as with a scanning electrode for a simple matrix type liquid crystal display apparatus.

Ninth Embodiment

In the second embodiment, a portion to which ultraviolet light is radiated is activated and thereby the accepting ability (coloring property) thereof is improved. By spraying a coloring material to this portion, a color filter is formed. In a ninth embodiment, the portion to which ultraviolet light is radiated is activated in the second embodiment is also hardened. The portion to which the ultraviolet light is not radiated is removed with a solvent or the like. The accepting layer corresponding to each pixel portion is formed in for example an island shape. For simplicity, in the ninth embodiment, similar portions to those according to the second embodiment are denoted by similar reference numerals and the description of the ninth embodiment will be described with reference to FIG. 2.

As with the case in the second embodiment, a light insulating layer 6 is formed. A color accepting base layer with a thickness of 2.0 $\mu$m is formed on the entire surface of the substrate including the light insulating layer 6. With a self alignment mask of the light insulating layer 6, ultraviolet light is selectively radiated to the color accepting base layer corresponding to each color cell. The accepting layer to which the ultraviolet light is selectively radiated is activated.

Thereafter, with a solution of a mixture of $H_2O$ and sodium hydroxide of 1%, the resultant structure is developed and the color accepting base layer that is not exposed to the ultraviolet light is removed.

Thereafter, the accepting layer that is not removed by the developing process but left is baked at 180° C. for one hour.

Coloring materials corresponding to three colors R, G, and B are sprayed to the accepting layer corresponding to each pixel portion that is activated and patterned in the island shape by ink jet method using an ink jet unit. Thus, the accepting layer is colored and thereby a color filter 7 is formed.

Tenth Embodiment

In the second embodiment, the light insulating layer 6 is formed with a laminate of chromium oxide and chromium. The color accepting base layer is formed on the entire surface of the light insulating layer. Ultraviolet light is radiated from the rear surface side of the the substrate surface on which the color accepting base layer is formed. With the mask of the light insulating layer 6, each pixel portion is exposed.

Figure 13:
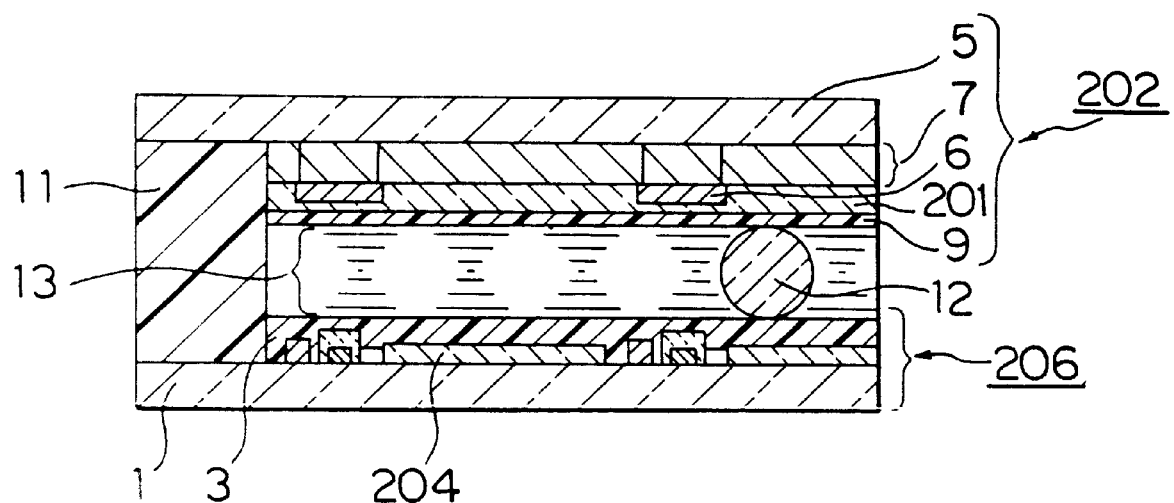
FIG. 13 is a sectional view showing a fabricating process of a liquid crystal display apparatus according to a tenth embodiment.

In a tenth embodiment, after a color accepting base layer is formed on a substrate, a light insulating layer 6 is formed of a black resin material. With a mask of the light insulating layer 6, ultraviolet light is radiated from the surface side of the substrate on which the color accepting base layer is formed and thereby each pixel portion is exposed. FIG. 13 is a sectional view showing the construction of a liquid crystal display apparatus fabricated by a fabricating method according to the tenth embodiment of the present invention.

For simplicity, in the tenth embodiment, similar portions to those according to the second embodiment are denoted by similar reference numerals. The portions that are different from those according to the second embodiment will be described with reference to FIGS. 2 and 13.

A color accepting base layer with a thickness of 2.0 $\mu$m is composed of casein and formed on a glass substrate 5 by roll coat method.

A black resin of which a carbon black is dispersed to a photosensitive acrylic resin is formed by spin coat method. With a photomask having a pattern of a predetermined light insulating layer, the resultant structure is exposed. Thereafter, the resultant structure is developed and thereby a light insulating layer 6 composed of the black resin is formed.

Thereafter, ultraviolet light is radiated onto the color accepting base layer from the surface side of a glass substrate 5 on which a light insulating layer 6 or the like are formed. At this point, since the light insulating layer 6 composed of the black resin functions as a mask, ultraviolet light is selectively radiated onto an opening portion corresponding to each pixel of the light insulating layer 6 on self alignment basis (in other words, the color accepting base layer corresponding to each color cell). Thus, the light accepting layer corresponding to the portion to which the ultraviolet light is selectively radiated is activated. The process after the coloring step for the color filter is the same as that in the second embodiment.

Eleventh Embodiment

In the third embodiment, with the mask of the scanning line and the signal line on the TFT array substrate, the ultraviolet light is selectively radiated onto each color cell including each pixel portion of the color accepting base layer.

In an eleventh embodiment, with a mask for ultraviolet light, a photomask is used instead of a scanning line and a signal line, the ultraviolet light is radiated from the main surface side of the substrate on which a color accepting base layer is formed.

For simplicity, in the eleventh embodiment, similar portions to those according to the second embodiment are denoted by similar reference numerals. Only the portions that are different from those in the second embodiment will be described with reference to FIG. 2.

In the same manner as the third embodiment, a color accepting base layer is formed. Thereafter, with a photomask having a pattern of an opening portion corresponding to each color cell including each pixel, ultraviolet light is radiated from the surface side on which the color accepting base layer is formed. At this point, the color accepting base layer covered with the light insulating pattern of the photomask is not exposed. The color accepting base layer corresponding to the opening portion (namely, each color cell) is exposed. The accepting properly of the exposed portion is improved and this portion is hardened. The non-hardened portion is removed with a solvent or the like and thereby the accepting layer is formed.

Twelfth Embodiment

In the fourth embodiment, with the mask of the scanning line and the signal line on the TFT array substrate, ultraviolet light is selectively radiated onto each color cell including each pixel portion of the color accepting base layer.

As a mask for the ultraviolet light, a photomask is used instead of a scanning line and a signal line. The ultraviolet light is radiated from the surface side of the substrate on which the color accepting base layer is formed. According to the twelfth embodiment, in the same manner as the eleventh embodiment, ultraviolet light is selectively radiated onto each color cell including each pixel portion of the color accepting base layer with the light insulating pattern of the photomask and thereby an accepting layer is formed.

In each of the above-described embodiments, when ultraviolet light is selectively radiated onto the accepting layer, if the concentration of oxygen in a working atmosphere of the radiation of ultraviolet light is higher than that in the conventional environment (normal temperature and normal pressure), the accepting layer by the radiation of ultraviolet light can be further hardened.

In the above-described embodiments, as the coloring materials, inks of three colors R, G, and B are used. However, it should be noted that the number of the colors of the inks are not limited to three. In addition, coloring materials (inks) corresponding to for example Y, M, and C (yellow, magenta, and cyan) may be used. In this case, an accepting layer that has a higher coloring ability is preferably used.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A liquid crystal display apparatus comprising:

a first substrate;

a plurality of scanning lines made of a light shielding material formed on the first substrate;

a plurality of signal lines made of a light shielding material formed on the first substrate crossing said scanning lines;

a plurality of switching elements formed at the vicinity of the intersection of the scanning lines and the signal lines;

a plurality of pixel electrodes connected to the switching elements;

a plurality of light transmitting portions surrounded by the scanning lines and the signal lines, each of the light transmitting portions having a contour formed by the scanning lines and the signal lines;

a second substrate opposed to the first substrate;

a liquid crystal material interposed between the first substrate and the second substrate; and a color filter made of a base member and a coloring member formed on the first substrate;

wherein the base member is made of an ultraviolet cure polymer, and has the same contour as the light transmitting portions have.

2. The liquid crystal display apparatus as set forth in claim 1, wherein the base member has a thickness of approximately 0.2 µm–0.4 µm.

3. The liquid crystal display apparatus as set forth in claim 1, wherein the base member is made of a polymer including at least one of PVA, casein polymer, acrylic polymer, epoxy denatured acrylic polymer and poly-silane.

4. The liquid crystal display apparatus as set forth in claim 1, wherein the color filter is interposed between the first substrate and the pixel electrodes.

* * * * *